(12) United States Patent
Vampola et al.

(10) Patent No.: US 10,833,227 B2
(45) Date of Patent: Nov. 10, 2020

(54) OPTICAL CAVITY INCLUDING A LIGHT EMITTING DEVICE AND WAVELENGTH CONVERTING MATERIAL

(71) Applicant: Lumileds LLC, San Jose, CA (US)

(72) Inventors: Kenneth Vampola, Los Altos, CA (US); Han Ho Choi, Sunnyvale, CA (US); Mark Melvin Butterworth, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/002,634

(22) Filed: Jun. 7, 2018

(65) Prior Publication Data

US 2018/0294385 A1    Oct. 11, 2018

Related U.S. Application Data

(63) Continuation of application No. 14/388,877, filed as application No. PCT/IB2013/052572 on Mar. 30, 2013, now Pat. No. 9,997,674.

(Continued)

(51) Int. Cl.
*H01L 33/46* (2010.01)
*G02F 1/13357* (2006.01)
(Continued)

(52) U.S. Cl.
CPC ...... *H01L 33/465* (2013.01); *G02F 1/133603* (2013.01); *H01L 25/0753* (2013.01);
(Continued)

(58) Field of Classification Search
CPC ..... H01L 33/504; H01L 33/507; H01L 33/58; H01L 33/465; H01L 25/0753; H01L 2933/54; H01L 33/54; G02F 1/133603
See application file for complete search history.

(56) References Cited

U.S. PATENT DOCUMENTS 6,809,342 B2   10/2004   Harada
7,052,152 B2    5/2006   Harbers et al.
(Continued)

FOREIGN PATENT DOCUMENTS

CN   102042562    5/2011
EP    1 976 030   10/2008
(Continued)

OTHER PUBLICATIONS

Simpson and Weiner, "The Oxford English Dictionary," Clarendon Press, V 20 (1989).

(Continued)

*Primary Examiner* — Patricia D Reddington

(57) ABSTRACT

Light emitting devices are described herein. A light-emitting device includes a substrate having a surface below an optical cavity, one or more light emitting diodes (LEDs) disposed above the surface of the substrate, a first wavelength-converting layer, and a second wavelength-converting layer. The first wavelength-converting layer is disposed on the surface of the substrate below the optical cavity, covers the entire surface of the substrate except for portions of the surface of the substrate that are situated underneath any of the one or more LEDs, and has a thickness that is equal to or less than a thickness of at least one of the one or more LEDs. The second wavelength-converting layer is disposed above the optical cavity.

15 Claims, 2 Drawing Sheets

Related U.S. Application Data

(60) Provisional application No. 61/617,919, filed on Mar. 30, 2012.

(51) Int. Cl.
*H01L 25/075* (2006.01)
*H01L 33/50* (2010.01)
*H01L 33/58* (2010.01)
*H01L 33/54* (2010.01)

(52) U.S. Cl.
CPC .......... *H01L 33/504* (2013.01); *H01L 33/507* (2013.01); *H01L 33/58* (2013.01); *G02F 2001/133614* (2013.01); *H01L 33/54* (2013.01); *H01L 2924/0002* (2013.01); *H01L 2933/0041* (2013.01)

(56) References Cited

U.S. PATENT DOCUMENTS

| | | | |
|---|---|---|---|
| 7,071,907 | B1 | 7/2006 | Duboc |
| 7,279,719 | B2 | 10/2007 | Suehiro et al. |
| 7,498,734 | B2 | 3/2009 | Suehiro et al. |
| 2002/0057056 | A1 | 5/2002 | Okazaki |
| 2003/0230751 | A1 | 12/2003 | Harada |
| 2005/0139851 | A1* | 6/2005 | Sato ............... H01L 33/507 257/99 |
| 2008/0105887 | A1 | 5/2008 | Narendran et al. |
| 2008/0203414 | A1* | 8/2008 | Yen ............... H01L 33/504 257/98 |
| 2008/0239724 | A1 | 10/2008 | Moriyama et al. |
| 2009/0206353 | A1* | 8/2009 | Okazaki ............... H01L 33/504 257/98 |
| 2009/0242919 | A1 | 10/2009 | Lin et al. |
| 2010/0149814 | A1 | 6/2010 | Zhai et al. |
| 2010/0237370 | A1 | 9/2010 | Kim et al. |
| 2010/0328926 | A1 | 12/2010 | Hoelen et al. |
| 2011/0069496 | A1 | 3/2011 | Ing et al. |
| 2011/0090672 | A1 | 4/2011 | Zhu |
| 2011/0284904 | A1* | 11/2011 | Okazaki ............... H01L 33/504 257/98 |
| 2012/0087124 | A1 | 4/2012 | Ravillisetty et al. |
| 2012/0140435 | A1 | 6/2012 | Li |
| 2013/0299865 | A1* | 11/2013 | Bechtel ............... H01L 33/44 257/98 |

FOREIGN PATENT DOCUMENTS

| | | |
|---|---|---|
| JP | 1995-001484 | 1/1995 |
| JP | 2001-185762 | 7/2001 |
| JP | 2002-057375 | 2/2002 |
| JP | 2002118290 A1 | 4/2002 |
| JP | 2004505470 A | 2/2004 |
| JP | 2005-093681 | 4/2005 |
| JP | 2005-191420 | 7/2005 |
| JP | 2005-277127 | 10/2005 |
| JP | 2007-294890 | 11/2007 |
| JP | 2008-544553 | 12/2008 |
| JP | 2009140822 A | 6/2009 |
| JP | 2009-267289 | 11/2009 |
| WO | 0211214 A | 2/2002 |
| WO | 2005/091386 | 9/2005 |
| WO | 2009/018558 | 2/2009 |
| WO | 2011097379 A1 | 8/2011 |

OTHER PUBLICATIONS

JP Office Action, Application 2015-502546, dated Jan. 31, 2017, 12 pages.
CN Office Action, Application 201380018280.2, dated Aug. 11, 2016, 22 pages.
EPO as ISA, PCT/IB2013/052572, filed Mar. 30, 2013, International Search Report and Written Opinion, dated Aug. 1, 2013, 11 pages.
English Translation of Office Action of Japan Patent Office, JP Application No. 2018-145818, dated Apr. 23, 2019, 5 pages.

* cited by examiner

OPTICAL CAVITY INCLUDING A LIGHT EMITTING DEVICE AND WAVELENGTH CONVERTING MATERIAL

CROSS-REFERENCE TO PRIOR APPLICATIONS

This application is a continuation of U.S. patent application Ser. No. 14/388,877, filed Sep. 29, 2014, which is the U.S. National Phase application under 35 U.S.C. § 371 of International Application No. PCT/IB2013/052572, filed on Mar. 30, 2013, which claims the benefit of U.S. Patent Application No. 61/617,919, filed on Mar. 30, 2012. These applications are hereby incorporated by reference herein.

FIELD OF THE INVENTION

The present invention relates to an optical cavity including a semiconductor light emitting device such as light emitting diode and a wavelength converting material such as a phosphor.

BACKGROUND

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III V semiconductors, particularly binary, ternary, and quaternary alloys of gallium, aluminum, indium, and nitrogen, also referred to as III nitride materials. Typically, III nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices may be combined with wavelength converting materials such as phosphors, as is known in the art, to form white light or light of other colors.

FIG. 1 illustrates a backlight described in more detail in U.S. Pat. No. 7,052,152. Column 5 line 33 through column 6 line 7 of U.S. Pat. No. 7,052,152 describes the device in FIG. 1 as a backlight configuration when only blue, UV, or near-UV LEDs are used, and where the color-converting phosphor layer 139 is on the cover plate 140. The cover plate 140 may or may not be a diffuser, depending on the amount of diffusion performed by the phosphor. The phosphor layer 139 is a uniform layer, consisting of one or more different type of phosphors. Preferably, a green and a red phosphor are used, but a yellow (YAG) phosphor could be used as well. This layer 139 can, for example, be applied by spray painting, screen-printing, or electrophoretic deposition, or might be a film with uniform density of particles or a luminescent dye distributed throughout the film. This configuration is attractive because the phosphor is not on top of the LED die, and light emitted from the phosphor to the rear of the backlight 126 has a larger recycling efficiency than into the LED chips, due to the high reflectivity of the films used in the backlight 126. And in addition to the recycling efficiency, the phosphor can be operated at a lower temperature and does not have chemical compatibility issues with the LED die, improving the efficiency and lifetime considerably. An LCD panel 114 is disposed over backlight 126.

In another embodiment, one type of phosphor is applied to the cover plate 140, preferably the green or amber phosphor, while another phosphor, preferably the red phosphor, is applied to the rear panel 148 of the backlight configuration. The rear panel acts as a diffuser. This phosphor is not applied as a uniform coating, but is applied as a dot pattern. The combination of blue light from the LEDs and the red and green light from the phosphor layers produces a substantially white backlight for the LCD panel 114. By separating the phosphor in such a configuration, higher conversion efficiency is achieved, while by optimizing the size and spacing of the phosphor dots the required color balance and gamut can be achieved.

SUMMARY

It is an object of the invention to form an optical system where an LED and a wavelength converting material are disposed on a substrate, which may improve the efficiency of the system.

Embodiments of the invention include a semiconductor light emitting diode attached to a substrate. A first region of wavelength converting material is disposed on the substrate. The wavelength converting material is configured to absorb light emitted by the semiconductor light emitting diode and emit light at a different wavelength. In the first region, the wavelength converting material coats an entire surface of the substrate. The substrate is disposed proximate a bottom surface of an optical cavity. A second region of wavelength converting material is disposed proximate a top surface of the optical cavity.

Embodiments of the invention include a semiconductor light emitting diode attached to a substrate. A first region of wavelength converting material is disposed on the substrate. The wavelength converting material is configured to absorb light emitted by the semiconductor light emitting diode and emit light at a different wavelength. The substrate is disposed proximate a bottom surface of an optical cavity. A second region of wavelength converting material is disposed proximate a top surface of the optical cavity. A reflective surface is disposed above the semiconductor light emitting diode. The reflective surface is configured to direct reflected light away from the semiconductor light emitting diode.

DETAILED DESCRIPTION

Figure 2:
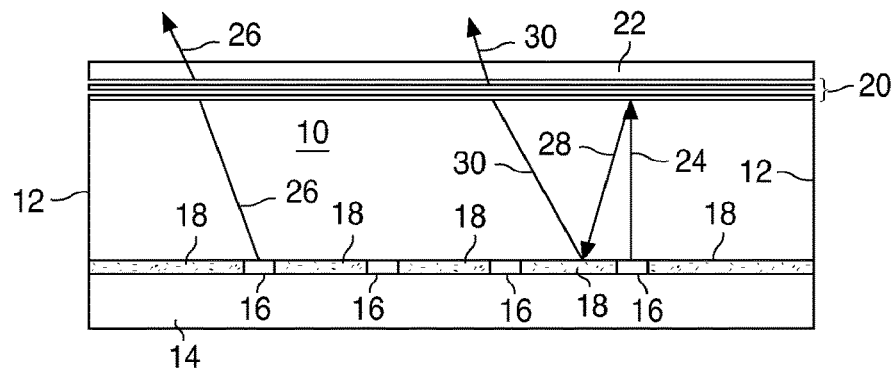
FIG. 2 illustrates an optical cavity with at least one semiconductor light emitting device attached to a substrate and a wavelength converting material disposed on the substrate.

FIG. 2 illustrates an optical cavity according to embodiments of the invention. One or more III-nitride LEDs 16 are disposed on a substrate 14 in or next to optical cavity 10. Though the examples below refer to III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used in embodiments of the invention.

Any suitable III-nitride LED may be used and such LEDs are well known. LEDs 16 may be, for example, flip chip devices configured to emit a majority of light from the top surface of the LED. To form such an LED, a III-nitride semiconductor structure is first grown on a growth substrate, as is known in the art. The growth substrate may be any suitable substrate such as, for example, sapphire, SiC, Si, GaN, or composite substrates. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art.

The semiconductor structure may be connected to a support through the p- and n-contacts. The support is a structure that mechanically supports the semiconductor structure. The support is a self-supporting structure suitable to attach to substrate 14 of FIG. 2. For example, the support may be reflow-solderable. Any suitable support may be used. Examples of suitable supports include an insulating or semi-insulating wafer with conductive vias for forming electrical connections to the semiconductor structure, such as a silicon wafer, thick metal bonding pads formed on the semiconductor structure, for example by plating, or a ceramic, metal, or any other suitable mount.

LEDs 16, which include the semiconductor structure, metal contacts, and support described above, are mounted on substrate 14. Substrate 14 may be optically reflective and thermally conductive. Electrical contact to LEDs 16 may be made through substrate 14. Examples of suitable substrates 14 include metal core printed circuit board, FR4-based printed circuit board, ceramic, metal, plastic, and silicone. In some embodiments, the top surface of substrate 14 is reflective, or is coated with a reflective substance such as a reflective paint or a layer of a reflective metal. Substrate 14 may have a thermal conductivity of at least 0.1 W/mK (silicone) in some embodiments, at least 10 W/mK in some embodiments, and at least 100 W/mK in some embodiments, and between 0.1 W/mK and 400 W/mK (copper) in some embodiments.

Figure 3:
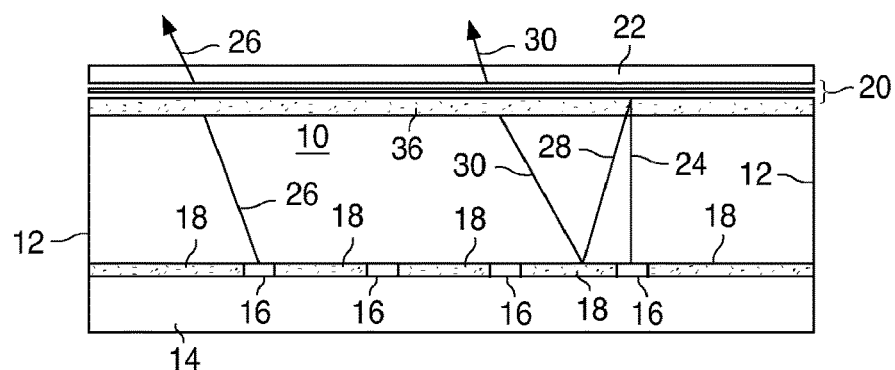
FIG. 3 illustrates an optical cavity with at least one semiconductor light emitting device attached to a substrate and wavelength converting material disposed at the top and bottom of the cavity.
Figure 4:
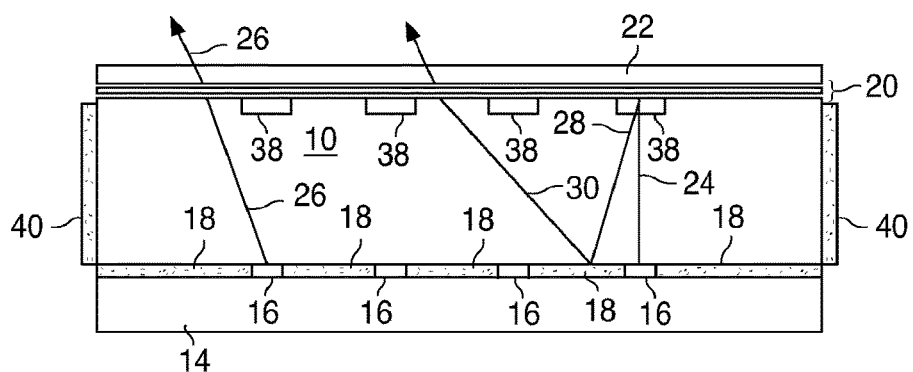
FIG. 4 illustrates an optical cavity with at least one semiconductor light emitting device attached to a substrate, wavelength converting material disposed at the sides of the cavity, and reflective regions disposed over the semiconductor light emitting devices.

Though multiple LEDs are illustrated in each of FIGS. 2, 3, and 4, in some embodiments of the invention a single LED 16 may be used. Multiple LEDs 16 may be arranged in any suitable arrangement on substrate 14. For example, four LEDs 16 may be arranged in a two by two square array on substrate 14, or multiple LEDs 16 may be arranged in a circle on substrate 14. Many variations are possible and within the scope of the invention.

Figure 1:
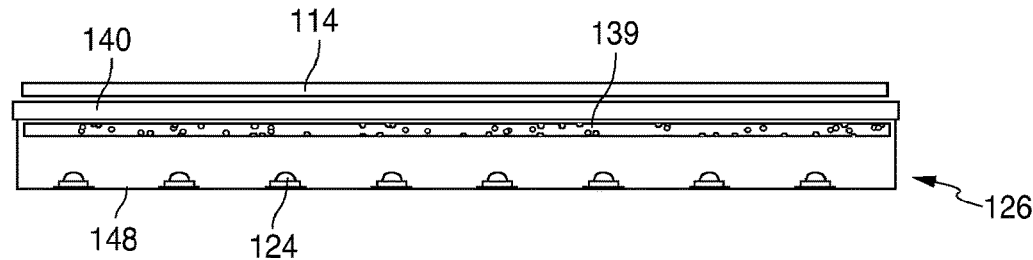
FIG. 1 illustrates a prior art backlight including a two dimensional array of LEDs.

Next to LEDs 16, one or more wavelength converting regions 18 are disposed on substrate 14. In devices including multiple LEDs 16, wavelength converting regions 18 may be disposed between LEDs 16. In some embodiments, rather than being formed as dots that only partially cover the surface of the substrate in the region where the wavelength converting region 18 is formed as in the device illustrated in FIG. 1, wavelength converting region 18 covers the entire surface of the substrate in the region where it is formed.

In some embodiments, there is no gap between the LEDs 16 and the edge of wavelength converting regions 18. For example, LEDs 16 may be mounted on substrate 14, then the entire structure including the LEDs 16 and substrate 14 is coated with wavelength converting material such that there is no gap between wavelength converting regions 18 and LEDs 16.

In some embodiments, there is a small gap between the LEDs 16 and the edge of wavelength converting regions 18. For example, wavelength converting regions 18 may be formed on substrate 14, then LEDs 16 are mounted in the areas between wavelength converting regions. Manufacturing tolerances require that a small gap between the edge of an LED 16 and the edge of a wavelength converting region 18 will not be covered with wavelength converting material.

Wavelength converting regions 18 are at least 0.5 mm wide in some embodiments and no more than 20 mm wide in some embodiments. Any gap between an LED 16 and the edge of a wavelength converting region 18 is between 0 mm and 0.5 mm in some embodiments. Wavelength converting regions 18 may be the same thickness as LEDs 16 in some embodiments. In the alternative, wavelength converting regions 18 may be thinner or thicker than LEDs 16.

Wavelength converting material in wavelength converting regions 18 absorbs light emitted by LEDs 16 and emits light of a different wavelength. Unconverted light emitted by the light emitting device is often part of the final spectrum of light extracted from the optical cavity, though it need not be.

Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the device.

The wavelength converting material may be conventional phosphors, organic phosphors, quantum dots, organic semiconductors, II-VI or III-V semiconductors, II-VI or III-V semiconductor quantum dots or nanocrystals, dyes, polymers, or materials such as GaN that luminesce. Any suitable phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)AlSiN$_3$:Eu and $(Ca,Sr,Ba)_2Si_5N_8$:Eu.

Any of the wavelength converting regions described herein may include a wavelength converting material disposed in a matrix of transparent material, such as silicone, epoxy, glass, or any other suitable material. The wavelength converting regions described herein may be, for example, thin films, ceramic slabs pre-formed or formed in situ with or without binder material other than the wavelength converting material itself, particles or powdered wavelength converting material mixed with a transparent binder such as silicone, epoxy, or any other suitable material and formed by screen printing, molding, spray coating, stenciling, or any other suitable technique. Each wavelength converting region described herein may include a single wavelength converting material, a mixture of wavelength converting materials, or multiple wavelength converting materials formed as separate layers rather than mixed together. Wavelength converting materials emitting different colors of light may be disposed in separate regions or mixed together.

The thickness of wavelength converting regions 18 depends on the wavelength converting materials and the deposition technique. The thickness of the wavelength converting regions may be between at least 0.5 μm in some embodiments, no more 500 μm in some embodiments, and no more than 1 mm in some embodiments. In various embodiments, wavelength converting material may be disposed over the tops of LEDs 16, or not disposed over the tops of LEDs 16, as illustrated in FIGS. 2, 3, and 4.

In some embodiments, the thickness and density of the wavelength converting material in wavelength converting regions 18 are selected such that little or no light incident on the top of wavelength converting regions 18 penetrates wavelength converting regions 18 to reach substrate 14. A wavelength converting layer formed such that no light reaches substrates may be advantageous for wavelength converting materials that are highly scattering and/or in applications where it is desirable to wavelength-convert a large fraction of light emitted by the LEDs 16. For example, in some embodiments where the structure emits warm white light, at least 90% of the light emitted by LEDs 16 is wavelength-converted by the wavelength converting regions.

In alternative embodiments, the thickness and density of wavelength converting material in wavelength converting regions 18 are selected such that at least some light is transmitted through the wavelength converting material and reflects off the substrate back through the wavelength converting material. Such a thinner layer may be advantageous for wavelength converting materials that are not highly scattering, such as, for example, organic phosphors, quantum dots, or dense ceramics; in applications where it is desirable to wavelength-convert a smaller fraction of light emitted by the LEDs 16; and/or when the wavelength converting material is expensive.

The substrate 14, LEDs 16, and wavelength converting regions 18 form the bottom surface of an optical cavity 10. Cavity 10 when viewed from the top may be any suitable shape, such as square or round. The sidewalls of cavity 10 need not be vertical as illustrated in FIGS. 2, 3, and 4, they may be sloped to form, for example, a truncated inverted pyramid or cone. The shape of cavity 10 may be dictated by the application. Cavity 10 may be a box filled with air (index of refraction of 1) or ambient gas, or a solid transparent material such as glass (index of refraction of 1.4-2.2), silicone (index of refraction of 1.4-2), transparent ceramic (index of refraction of 1.8), sapphire (index of refraction of 1.76), SiC (index of refraction of 2.4), cubic zirconia (index of refraction of 2.15), diamond (index of refraction of 2.4), GaN (index of refraction of 2.4), epoxy, or any other suitable material. In some embodiments, a solid material for cavity 10 is selected to have a refractive index as close as possible to the refractive index of LEDs 16 (III-nitride material with an index of refraction that varies but is often about 2.4). Optical cavity 10 has an index of refraction of at least 1 in some embodiments, no more than 2.4 in some embodiments, at least 1.8 in some embodiments, and at least 2 in some embodiments. The thickness of a solid, transparent material forming optical cavity 10 may be at least 0.5 mm in some embodiments and no more than 3 mm in some embodiments, though both thicker and thinner optical cavities 10 are possible and within the scope of the invention.

In the case of an optical cavity 10 that is a solid transparent material, the structure including substrate 14, LEDs 16, and wavelength converting regions 18 may be attached to the solid transparent material by an adhesive such as silicone, or by another other suitable technique or material.

LEDs 16 and the wavelength converting regions 18 are both disposed on or near substrate 14, where heat may be efficiently dissipated through substrate 14, for example by configuring substrate 14 as a heat sink or by thermally connecting substrate 14 to a heat sink. Because wavelength converting regions 18 can be kept relatively cool during operation over a variety of driving conditions, problems associated with heating, such as reduced quantum efficiency and shifting of the emitted wavelength, are reduced or eliminated. In addition, because wavelength converting regions 18 not formed directly in the path of light from LEDs 16, the incident optical intensity on the wavelength converting regions is kept low, which may improve the quantum efficiency of the wavelength converting material. The thermal resistivity of the path between the LEDs 16 and the substrate 14, or of the path between the wavelength converting regions 18 and substrate 14, is at least 0.1 cm$^2$K/W in some embodiments, no more than 50 cm$^2$K/W in some embodiments, at least 1 cm$^2$K/W in some embodiments, and no more than 2 cm$^2$K/W in some embodiments.

In some embodiments, the sidewalls 12 of optical cavity 10 are reflective. In the case where cavity 10 is a box, sidewalls 12 may be reflective, solid walls, or a reflective material disposed on or attached to solid walls. In the case where cavity 10 is a solid transparent material, sidewalls 12 may be a reflective foil or reflective material disposed on the sides of the solid transparent material.

In some embodiments, an optional filter 20 is disposed on the top of optical cavity 10. For example, filter 20 may be an interference-based dichroic reflecting layer, or any other suitable filter. In the case where cavity 10 is a box, a dichroic filter 20 may be a sheet of dichroic material, or a dichroic layer coated or formed on the top or bottom of a transparent sheet such as glass or plastic, which may or may not function as a cover over the structure illustrated in FIG. 2. In the case where cavity 10 is a solid transparent material, a dichroic filter 20 may be coated or formed on the top surface of the solid transparent material.

Filter 20 is configured to reflect all or a majority of light emitted by LEDs 16 and incident on filter 20 at small angles relative to a normal to the top surface of LEDs 16, as illustrated by ray 24. Such light is reflected, as illustrated by ray 28. In some embodiments, filter 20 is optionally configured to be less reflective of light emitted by LEDs 16 and incident on filter 20 at large angles relative to a normal to the top surface of LEDs 16, such that some large-angle light escapes, as illustrated by ray 26. Filter 20 may also be configured to transmit all or a majority of light that is wavelength converted by wavelength converting regions 18 at any angle, as illustrated by ray 30.

An optional scattering layer 22 may be formed over filter 20, or over optical cavity 10 in embodiments that do not include a filter 20. Scattering layer 22 may include scattering particles such as $TiO_2$ or any other suitable material disposed in a transparent matrix such as silicone, epoxy, glass, or any other suitable material. In some embodiments, instead of or in addition to scattering layer 22, scattering particles may be disposed within the total volume or part of the volume of cavity 10.

During operation, a fraction of light emitted from LEDs 16 is redirected by optional filter 20 and optional scattering layer 22 back toward the bottom surface of cavity 10. Light incident on wavelength converting regions 18 is converted, i.e. absorbed and reemitted at a longer wavelength. Converted light is directed upward by scattering from wavelength converting regions 18 and by reflective substrate 14 into cavity 10. The converted light and a fraction of unconverted light from LEDs 16 escapes through filter 20, possibly after one or more reflections off the reflective edges of cavity 10, and/or possibly after being scattered by scattering layer 22 or other surfaces. The above-described reflection and scattering events serve to mix converted and unconverted light, and distribute unconverted light more uniformly over the wavelength converting regions 18, which may reduce "hot spots", i.e. spots on wavelength converting regions 18 that experience higher relative intensity of unconverted light. Since many suitable wavelength converting materials are most efficient when the intensity of unconverted pump light is low, the more uniform excitation helps improve overall system efficiency.

The fraction of unconverted light from LEDs 16 that is transmitted through filter 20 may be adjusted to ensure that the desired fraction of the pump light escapes the cavity. For example, for a white colorpoint, in various embodiments 5% to 30% of the light escaping cavity 10 should be unconverted light from LEDs 16, depending on the desired color temperature of the mixed light, and depending on the spectral properties of the light emitted from LEDs 16 and wavelength converting regions 18. The fraction of unconverted light that is transmitted may be adjusted in embodiments including a dichroic filter 20 by selecting the materials used in the layers of the dichroic filter, the thicknesses of the layers and the number of layers in the dichroic filter, as is known in the art. In embodiments including a scattering layer 22, the fraction of unconverted light that is transmitted may be adjusted by increasing or decreasing scattering to increase or decrease conversion. Scattering can be increased by increasing the concentration of scattering particles, increasing the thickness of the scattering layer, changing the composition of the scattering particles, changing the size and shape of the scattering particles or changing the composition of the matrix in which the scattering particles are embedded. Scattering can be also be increased by roughening surfaces of optical cavity 10, such as the top or side surfaces of optical cavity 10. In some embodiments, the fraction of unconverted light is increased by decreasing the thickness and/or concentration of wavelength converting material in the wavelength converting regions. In some embodiments, the fraction of unconverted light is increased by introducing scattering particles into wavelength converting region 18, which causes a larger fraction of incident light to be scattered away from the wavelength converting material, rather than absorbed by the wavelength converting material. Scattering particles can be disposed in a separate layer above the wavelength converting material, or mixed with the wavelength converting material. In some embodiments, the fraction of unconverted light that is transmitted is increased by forming scattering layer 22 and/or filter 20 on only a portion of the top of optical cavity 10.

In some embodiments, filter 20 and scattering layer 22 are adjusted to reduce angular variations in the color of light emitted from the structures illustrated in FIGS. 2, 3, and 4. In some embodiments, angular variations are reduced by increasing the scattering at the top of optical cavity 10, for example by adding scattering particles at the top surface, adding scattering wavelength converting particles at the top surface, roughening the top surface of cavity 10, and/or adding scattering particles to the bulk of cavity 10. In some embodiments, angular variations are reduced by adjusting the angular transmittance properties of filter 20 (if present) to selectively transmit light at desirable angles, as is known in the art. In some embodiments, angular variations are reduced by adjusting the amount of wavelength converting material added to the sidewalls of optical cavity 10 and/or by adjusting transmission of light through the sidewalls.

FIG. 3 illustrates an optical cavity 10 with wavelength converting regions disposed at the top and bottom of the optical cavity. In the structure of FIG. 3, first wavelength converting regions 18 are disposed between LEDs 16 as in FIG. 2. Second wavelength converting regions 36 are disposed at the top of cavity 10, for example just below or just above filter 20 in embodiments including filter 20, or just below or just above scattering layer 22 in embodiments including scattering layer 22. Second wavelength converting region 36 may be a single, continuous region that covers the entire top of cavity 10, as illustrated in FIG. 3, or it may be formed in smaller regions separated by spaces, transparent material, or another material such as a scattering material. Second wavelength converting region 36 may be formed by any suitable technique on the top surface of cavity 10, the bottom surface of filter 20, the top surface of filter 20, or on a separate sheet of transparent material, for example.

Any of the above-described characteristics of wavelength converting regions 18, including but not limited to materials, thickness, and deposition techniques, may be applied to wavelength converting regions 36 in embodiments of the invention. Wavelength converting regions 18 and 36 need not have the same characteristics, though they may in some embodiments.

In some embodiments, a second wavelength converting material is mixed with the scattering particles in scattering layer 22, rather than formed as a second, separate layer 36 as illustrated in FIG. 3.

A single or multiple wavelength converting materials may be included in each of wavelength converting regions 18 and wavelength converting region 36. Wavelength converting materials emitting different colors of light may be separated or mixed. Scattering or other non-wavelength-converting materials may be added to either or both of wavelength converting regions 18 and 36.

In some embodiments, in systems with wavelength converting regions on the top and bottom of cavity 10, the reflectivity of the top surface of cavity 10 (i.e. the reflectivity of filter 20) can be reduced to allow more light to be transmitted by filter 20, which may improve the efficiency of the structure. Since there is a top wavelength converting region, less light from LEDs 16 is required to be incident on the bottom wavelength converting regions, therefore less light must be reflected toward the bottom of optical cavity 10. As a result, filter 20 may be less reflective. In addition, scattering caused by the wavelength converting region on the top of the cavity 10 may increase the amount of light directed toward wavelength converting regions 18 on the bottom of the cavity, and may reduce the amount of scattering material needed in scattering layer 22 or may eliminate the need for scattering layer 22 altogether.

In some embodiments, the wavelength converting regions disposed on the bottom of cavity 10 include the wavelength converting materials that suffer the worst degradation of performance with increased temperature, since the wavelength converting regions on the bottom of cavity 10 can be more readily cooled than the wavelength converting regions on the top of cavity 10.

In some embodiments, the device includes wavelength converting material A which can be excited by light emitted by another wavelength converting material B. Wavelength converting material A may be disposed in the wavelength converting regions on the bottom of cavity 10, while wavelength converting material B may be disposed in the wavelength converting region on the top of cavity 10, to minimize interaction between the wavelength converting materials.

For example, devices that make white light often include a blue LED and red- and green- or yellow-emitting phosphors. Many phosphors that emit red light will absorb light emitted by the green- or yellow-emitting phosphor. Many red-emitting phosphors are also temperature sensitive. In some embodiments, a red-emitting phosphor is disposed on the bottom of cavity 10 and a green- or yellow-emitting phosphor is disposed on the top of cavity 10. In such an arrangement, the red-emitting phosphor may absorb less green or yellow light than in a system where the red- and green/yellow-phosphors are mixed, which may improve the color rendering index of the mixed light, may improve the efficiency of the device, and may simplify color targeting.

In some embodiments, a red-emitting phosphor is disposed on the top of cavity 10 and a green- or yellow-emitting phosphor is disposed on the bottom of cavity 10. In some embodiments, a red-emitting and green/yellow-emitting phosphor are mixed, and the mixture is disposed on both the top and bottom of cavity 10. In some embodiments, a mixture of a red-emitting phosphor and red-emitting quantum dots is disposed on the bottom of cavity 10 and a mixture of multiple types of green-emitting phosphors is disposed on the top of cavity 10. In some embodiments, a single red-emitting phosphor is disposed on the bottom of cavity 10 and a mixture of the same or a different red-emitting phosphor and a green/yellow-emitting phosphor is disposed on the top of cavity 10.

During operation of the system illustrated in FIG. 3, a fraction of the light 26 from LEDs 16 is transmitted unconverted through the top of the cavity 10 and is extracted. Unconverted light may also reflect several times inside the cavity 10 before escaping cavity 10. Another fraction of the light from the LEDs 16 is absorbed by wavelength converting region 36 and reemitted at a different wavelength. Some of this reemitted light escapes immediately and some enters the cavity 10 where it may reflect a number of times before being extracted out the top of cavity 10. A final portion 24 of the light from LEDs 16 reflects off of the top of the cavity 10 and is incident on wavelength converting regions 18. Wavelength converting regions 18 absorb some of this light and reemit it at a different wavelength, and reflect the rest. Wavelength converted or reflected unconverted light may reflect a number of times before being extracted out of the top of cavity 10.

FIG. 4 illustrates possible modifications to either of the structures illustrated in FIGS. 2 and 3. In some embodiments, the area of the top of cavity 10 directly over LEDs 16 is made more reflective than filter 20 in embodiments where a filter 20 is included, or is made reflective in embodiments where a filter 20 is not included. For example, reflective regions 38 may be formed directly over LEDs 16 at the top of cavity 10, such that light from LEDs 16 encounters reflective regions 38 before filter 20 or scattering layer 22. Reflective regions 38 may be, for example, disks of reflective metal foil or other reflective material disposed on the top of cavity 10 or on the bottom of filter 20, on a transparent cover, or on any other suitable layer.

Figure 5:
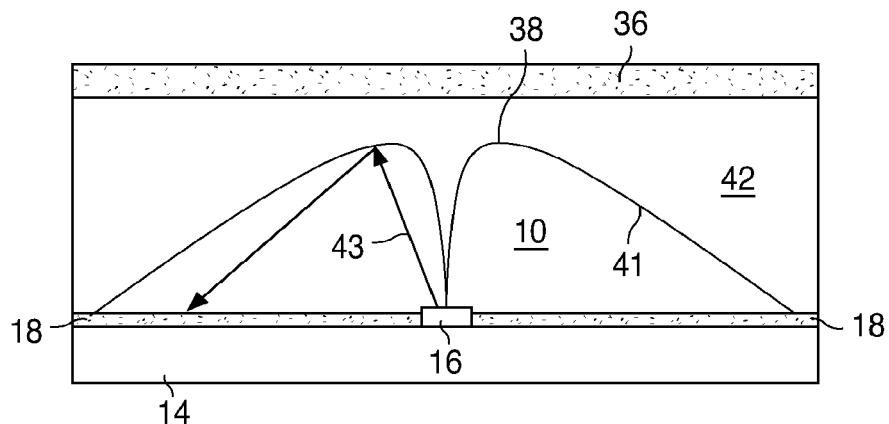
FIGS. 5, 6, and 7 illustrate optical cavities with shaped reflective regions.
Figure 6:
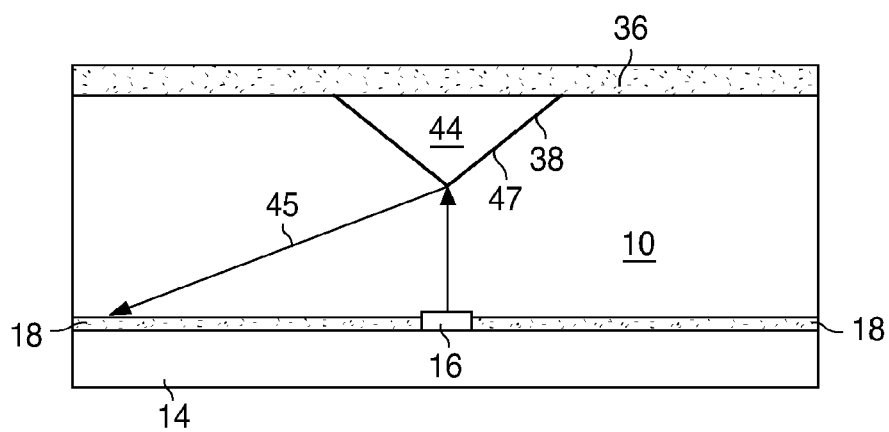
Figure 7:
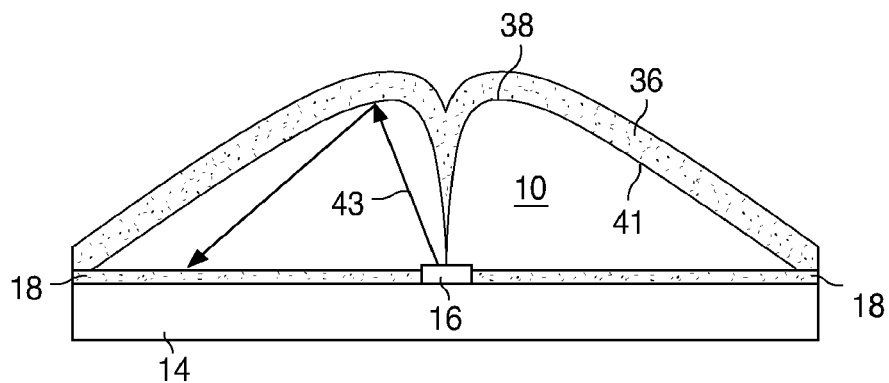

If the light reflected by reflective regions 38 is directed back towards LEDs 16, the light may be absorbed by LEDs 16 and lost. In some embodiments, reflective regions 38 are configured to direct reflected light away from LEDs 16. For example, the reflective regions illustrated in FIG. 4 may have a roughened, textured, or patterned surface that directs the reflected light away from LEDs 16. FIGS. 5, 6, and 7 illustrate examples of shaped reflective regions 38 that direct reflected light away from LEDs 16. Though FIGS. 5, 6, and 7 illustrate one LED 16, the reflective regions 38 illustrated can be repeated over multiple LEDs in a cavity 10. The reflective regions 38 illustrated are often rotationally symmetric around a normal to the top surface of LED 16, though they need not be in some embodiments.

The reflective region 38 illustrated in FIG. 5 has a surface 41 that rises from proximate the center of LED 16 toward the top of cavity 10, then extends back toward wavelength converting regions 18. As the surface 41 extends down toward wavelength converting regions 18, it gets further from LED 16. The surface 41 is illustrated in FIG. 5 as contacting both the top surface of LED 16 and the top surface of wavelength converting region 18, though it need not contact either or both surfaces in some embodiments. As illustrated by ray 43, light emitted from LED 16 is reflected off surface 41 away from LED 16 and toward wavelength converting region 18. The surface 41 may be curved as illustrated in FIG. 5 or flat, and it may include both curved portions and flat portions. In some embodiments, top wavelength converting region 36 may be omitted and wavelength converting material may be disposed in region 42.

FIG. 7 illustrates a system including a reflective region 38 with the same shape as in FIG. 5. In FIG. 7, region 42 of FIG. 5 is omitted and the surface 41 of reflective region 38 forms the top surface of optical cavity 10. Wavelength converting region 36 is formed over reflective region 38 as a conformal coating, i.e. a coating with a substantially uniform thickness. For example, the thickness of wavelength converting region 36 in FIG. 7 may vary by less than 50%. The structure illustrated in FIG. 7 may be formed by molding optical cavity 10 over substrate 14, LED 16, and wavelength converting region 18, then molding wavelength converting region 36 over optical cavity 10, or pressing a preformed, flexible wavelength converting sheet over optical cavity 10. As in FIG. 5, the reflective region 38 need not have the precise shape illustrated in FIG. 7.

The reflective region 38 illustrated in FIG. 6 has a surface 47 that rises diagonally from a region of optical cavity 10 above and proximate the center of LED 16 up toward wavelength converting region 36 and away from LED 16. Surface 47 may also be considered a protrusion such as an inverted cone or pyramid that extends from a base at the top of cavity 10 toward a point positioned below the top of cavity 10 and above LED 16. The surface 47 is illustrated in FIG. 6 as being spaced apart from the top surface of LED 16, though it may contact LED 16 in some embodiments. As illustrated by ray 45, light emitted from LED 16 is reflected off surface 47 away from LED 16 and toward wavelength converting region 18. The surface 47 may be flat as illustrated in FIG. 6 or curved, and it may include both curved portions and flat portions.

In some embodiments, the structures illustrated in FIGS. 5 and 6 reflect by total internal reflection, by creating a difference in index of refraction at surfaces 41 and 47 between the top of reflective region 38 (42 in FIG. 5, 44 in FIG. 6) and the bottom of reflective region 38 (cavity 10). Because the reflective regions 38 reflect by total internal reflection, light incident on the surfaces 41 and 47 at angles less than the critical angle is transmitted through the surfaces rather than reflected. The structures may be molded in some embodiments. For example, the structure of FIG. 5 may be molded on wavelength converting region 36 or another suitable structure such as a transparent cover, then positioned over substrate 14 such that cavity 10 is air and region 42 is molding compound, silicone, or any other suitable material. The structure of FIG. 6 may be molded over substrate 14 such that region 44 is air and cavity 10 is molding compound, silicone, or any other suitable material. In some embodiments, the difference in index of refraction that forms reflective regions 38 is between air and glass or any of the materials described above as suitable to form cavity 10. For example, regions 42 and 44 may be glass and cavity 10 may be air, or regions 42 and 44 may be air and cavity 10 may be glass. The difference in index of refraction between the two materials forming the surfaces illustrated in FIGS. 5 and 6 may be at least 0.4 in some embodiments, at least 0.5 in some embodiments, at least 0.8 in some embodiments, and at least 1 in some embodiments. In some embodiments, the reflective regions 38 illustrated in FIGS. 5 and 6 are formed or coated with reflective material.

Returning to FIG. 4, in some embodiments, wavelength converting and/or scattering materials are disposed on the sides of optical cavity 10. For example, wavelength converting regions 40 may be formed on the sidewalls of cavity 10. Wavelength converting regions may include a wavelength converting material such as a phosphor that is mixed with a transparent material such as silicone, then coated on the sides of cavity 10, disposed on a transparent sheet of material that is positioned adjacent the sides of cavity 10, or formed into a film that is attached to the sides of cavity 10. Light encountering wavelength converting regions 40 is absorbed and reemitted at a different wavelength or reflected.

Embodiments of the invention may have advantages. Since at least part of the wavelength converting material is disposed such that it can be kept cool, such as on substrate 14, efficiency of the system may be improved over systems where the wavelength converting material is subject to heating. Color over angle variation in the light extracted by the system may be minimized while maintaining high efficiency. In addition, the fraction of light converted may be made independent of the wavelength converting material loading and thickness of the wavelength converting regions, such that the color point of the mixed light may be immune to minor process variations in the formation of the wavelength converting regions.

Having described the invention in detail, those skilled in the art will appreciate that, given the present disclosure, modifications may be made to the invention without departing from the spirit of the inventive concept described herein. For example, different elements of different embodiments may be combined to form new embodiments. Therefore, it is not intended that the scope of the invention be limited to the specific embodiments illustrated and described.

The invention claimed is:

1. A light-emitting device, comprising:
   one or more light emitting diodes (LEDs) disposed on a surface of a substrate;
   a first wavelength-converting layer disposed on the surface of the substrate, the first wavelength-converting layer covering the entire surface of the substrate except for portions of the surface of the substrate that are situated underneath any of the one or more LEDs, and the first wavelength-converting layer having a thickness that is equal to or less than a thickness of at least one of the one or more LEDs;
   a second wavelength-converting layer disposed above the one or more LEDs and the first wavelength-converting layer; and
   an optical cavity between the first and second wavelength-converting layers.

2. The light-emitting device of claim 1, wherein the thickness of the first wavelength-converting layer is between 0.5 μm and 500 μm.

3. The light-emitting device of claim 1, wherein the thickness of the first wavelength-converting layer is between 0.5 μm and 1 mm.

4. The light-emitting device of claim 1, wherein the first wavelength-converting layer and the second wavelength-converting layer are configured to emit different colors of light.

5. The light-emitting device of claim 1, wherein the first wavelength-converting layer is configured to transmit some of light incident on the first wavelength-converting layer toward the substrate and transmit at least a portion of light that is reflected off the substrate back toward the second wavelength-converting layer.

6. The light-emitting device of claim 1, wherein the first wavelength-converting layer is configured to prevent any light that is incident on the first wavelength-converting layer from reaching the substrate.

7. The light-emitting device of claim 1, further comprising a filter formed above the second wavelength-converting layer that is configured to transmit a portion of unconverted light that is emitted from the one or more LEDs while reflecting another portion of the unconverted light towards the first wavelength-converting layer, wherein the filter is the layer.

8. The light-emitting device of claim 1, wherein the surface of the substrate is a reflective surface.

9. The light-emitting device of claim 1, comprising a scattering layer disposed above the second wavelength-converting layer.

10. A light-emitting device, comprising:
one or more light emitting diodes (LEDs) disposed on a surface of a substrate;
a first wavelength-converting layer disposed on the surface of the substrate, the first wavelength-converting layer covering the entire surface of the substrate except for portions of the surface of the substrate that are situated underneath any of the one or more LEDs, the first wavelength-converting layer having a thickness that is equal to or less than a thickness of any of the one or more LEDs, and the first wavelength-converting layer being formed of a plurality of wavelength-converting materials disposed in different regions of the first wavelength-converting layer;
a second wavelength-converting layer disposed above the one or more LEDs and the first wavelength-converting layer; and
an optical cavity between the first and second wavelength-converting layers.

11. The light-emitting device of claim 10, wherein the thickness of the first wavelength-converting layer is between 0.5 μm and 500 μm.

12. The light-emitting device of claim 10, wherein the thickness of the first wavelength-converting layer is between 0.5 μm and 1 mm.

13. The light-emitting device of claim 10, wherein each of the wavelength converting materials in the plurality is configured to emit a different color of light.

14. The light-emitting device of claim 10, wherein the first wavelength-converting layer is configured to transmit some of light incident on the first wavelength-converting layer toward the substrate and transmit at least a portion of light that is reflected off the substrate back toward the second wavelength-converting layer.

15. The light-emitting device of claim 10, wherein the first wavelength-converting layer is configured to prevent any light that is incident on the first wavelength-converting layer from reaching the substrate.

* * * * *